United States Patent [19]

Glorioso

[11] 3,715,608

[45] Feb. 6, 1973

[54] PROGRAMMABLE CIRCUIT AND METHOD

[75] Inventor: Charles A. Glorioso, Chicago, Ill.

[73] Assignee: Teletype Corporation, Skokie, Ill.

[22] Filed: Sept. 23, 1970

[21] Appl. No.: 74,668

[52] U.S. Cl. ....................307/308, 307/254, 307/256, 317/234 R, 250/106 R

[51] Int. Cl. ..........................H03k 23/22, G21h 5/06

[58] Field of Search.....307/278, 201, 311; 330/30 D, 330/59; 250/83.1, 219, 106 R; 317/26

[56] References Cited

UNITED STATES PATENTS

| | | | |
|---|---|---|---|
| 2,923,836 | 2/1960 | Richard et al. | 307/278 |
| 3,479,509 | 11/1969 | Grundy et al. | 250/83.1 |
| 3,273,060 | 9/1966 | Schneider | 330/30 D X |
| 3,528,350 | 9/1970 | Schmitt | 250/209 |
| 3,253,153 | 5/1966 | Stoddard | 250/209 |

*Primary Examiner*—John S. Heyman
*Assistant Examiner*—B. P. Davis
*Attorney*—J. L. Landis and R. P. Miller

[57] ABSTRACT

Specifically, first and second diffused silicon diodes are connected to first and second transistors, respectively, to control the conduction thereof, conduction of the first transistor providing a first output from the circuit and conduction of the second transistor providing a second output from the circuit. One of the diodes is irradiated with fast neutrons to raise its forward voltage drop above that of the other diode. When the first diode is irradiated so that it has a higher forward voltage drop than the second diode, the first transistor is rendered conductive to the exclusion of the conduction of the second transistor to provide a first output from the circuit in response to an input to the circuit, and vice versa. In general, electrical devices with radiation - alterable parameters are selectively irradiated to program the output of a circuit such as a read-only memory.

33 Claims, 2 Drawing Figures

INVENTOR
CHARLES A. GLORIOSO

BY J. L. Landis
ATTORNEY

PROGRAMMABLE CIRCUIT AND METHOD

BACKGROUND OF THE INVENTION

The present invention relates to a programmable circuit and to a method of programming the circuit, and in particular to a read-only memory circuit which may be programmed by selectively irradiating one of two electrical devices, such as irradiating a diode with fast neutrons.

In modern code converters and message generators it is ordinarily necessary to employ a large number of read-only memory circuits to provide a predetermined output in response to an input. To minimize the number of different read-only memory circuits required, and to simplify the programming of the output of the code converter or the message generator, it is desirable that all read-only memory circuits employed be initially identical and that convenient means be provided for programming the read-only memory circuit to provide its predetermined output once it has been installed in a code converter or a message generator.

An object of the invention is to provide a readily programmable read-only memory circuit and a method of programming the same, wherein the output may be selected by irradiating a selected one of two electrical components.

SUMMARY OF THE INVENTION

The foregoing and other objects of the invention are accomplished by providing first and second radiation-sensitive electrical devices, and selectively irradiating one of the devices the devices being of a type experiencing a progressive and irreversible change in the electrical parameter over a usable range with increasing doses of radiation. The devices are arranged in a circuit designed to produce a first output in response to an applied input to the circuit if the first device has been irradiated, and to produce a second output if the second device has been irradiated.

Preferrably, first and second diffused silicon diodes are connected to first and second transistor switching devices, respectively, the first diode being connected to control the conduction of the first transistor and the second diode being connected to control the conduction of the second transistor. A source of fast neutrons is provided for selectively irradiating one of the diodes to irreversibly increase the forward voltage drop thereof above the forward voltage drop of the non-selected diode, and means are provided for applying a potential across the diodes. When a potential is applied across the diodes, the diode having the greater forward voltage drop operates to render conductive its associated transistor to the exclusion of the conduction of the other transistor, so that irradiation of the first diode provides a first output from the system and so that irradiation of the second diode provides a second output from the system.

Other objects, advantages and features of the invention will be apparent from the following detailed description of a specific embodiment thereof, when taken in conjunction with the appended drawing.

DETAILED DESCRIPTION

Figure 1:
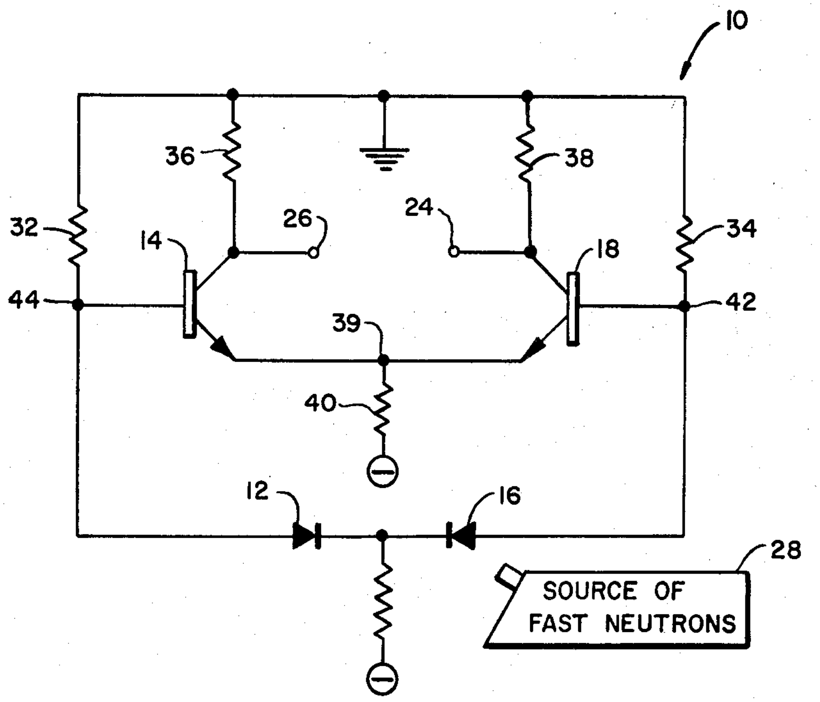
FIG. 1 is a circuit diagram of a preferred embodiment of the invention.

Referring to FIG. 1 of the drawings, there is shown a programmable read-only memory circuit 10 wherein the anode of a first diffused silicon diode 12 is connected to the base of a switching transistor 14 and wherein the anode of a second diffused silicon diode 16 is connected to the base of a switching transistor 18. The circuit is characterized in that a negative potential is provided at an output 24, connected to the collector of the transistor 18, and a ground potential is provided at an output 26, connected to the collector of the transistor 14, in response to an input to the circuit if the diode 16 has been irradiated by a source of fast neutrons 28, and in that a negative potential is provided at the output 26, and a ground potential is provided at the output 24, in response to an input to the circuit if the diode 12 has been irradiated by a source of fast neutrons. In the description of the operation of the circuit shown in the drawing, reference will be made to negative and to ground potentials. These terms for defining potential used in the circuit are relative terms used to illustrate the operation of the circuit and are not to be considered limiting, since any other two potentials could be used, the potential being substituted for the negative potential referred to in the specification being merely more negative than the potential being substituted for the ground potential.

The specific embodiment of the programmable read-only memory circuit 10 includes two equal value base resistors 32 and 34, the base resistor 32 being connected between the base of the transistor 14 and a source of ground potential and the base resistor 34 being connected between the base of the transistor 18 and the source of ground potential, and also includes two equal value collector resistors 36 and 38, the resistor 36 being connected between the collector of the transistor 14 and the source of ground potential and the resistor 38 being connected between the collector of the transistor 18 and the source of ground potential. The transistors 14 and 18 are identical, and have their emitters connected together at a junction point 39 and to a source of negative potential through a resistor 40. The diodes 12 and 16 are initially identical and have their cathodes connected both together and to a source of negative potential through a resistor 41.

To program the read-only memory cell, one of the diodes 12 and 16 is irradiated with fast neutrons by its associated source of fast neutrons, thereby raising its forward voltage drop with respect to that of the other diode which has not been irradiated with fast neutrons. As disclosed in the article "Fast Neutron Dosimeter Provided by Tiny Diffused Silicon Diode" by D. D. Malmborg, on pages 62 and 63 of the May 26, 1969, issue of *Design News* magazine, Volume 24, No. 11, published by the Rogers Publishing Company in 1969, bombardment of a diffused silicon diode by fast neutrons causes permanent defects in the crystal lattice of the diode, which defects act as traps for charge carriers. As a result the forward voltage drop of the diode, measured at a specific current, is permanently increased with increased fast neutron exposure. The increase in the forward voltage drop of the diode is a measure of the total fast neutron dose received by the diode. Therefore, the diodes exhibit a progressive, unidirectional and irreversible increase in the forward voltage drop thereof with increasing doses of radiation provided by a source of fast neutrons.

For example, assume that the diode 16 is irradiated so that its forward voltage drop with respect to that of the diode 12 is increased when an input comprising the negative and the ground potentials is applied to the circuit. When the input is applied to the circuit, current initially flows through two paths, one current path being defined from the source of ground potential, through the resistor 32, the diode 12, and the resistor 41 to the source of negative potential, and the other current path being defined from the source of ground potential, through the resistor 34, the diode 16, and the resistor 41, to the source of negative potential.

Since the forward voltage drop of the diode 16 has been increased by irradiation of the diode 16 with fast neutrons, the potential at a junction point 42, which is common with the base of the transistor 18, is more positive than the potential at a junction point 44, which is common with the base of the transistor 14. And since the emitters of both the transistors 14 and 18 are connected to the junction point 39, and are therefore at the same potential, the transistor 18 is rendered conductive before the transistor 14 is rendered conductive as a result of the transistor 18 having a greater base-to-emitter potential than the transistor 14. When the transistor 18 conducts, the voltage at a junction point 39, which is common to the emitters of both the transistors 14 and 18, becomes positive with respect to the voltage normally present when neither of the transistors 14 or 18 is conducting as a result of the voltage divider effect between the resistors 38 and 40 when a path is established through the transistor 18. As a result of the more positive potential at the junction point 39, the voltage difference between the base and the emitter of the transistor 14 decreases, thereby preventing the transistor 14 from conducting.

The output 24 at the emitter of the transistor 18 displays a negative voltage when the transistor 18 conducts as a result of the voltage divider effect of the resistors 38 and 40. The output 26 at the collector of the transistor 14 displays a ground potential, obtained through the resistor 36, as a result of the failure of the transistor 14 to conduct. Therefore, when the diode 16 is irradiated to increase its forward voltage drop with respect to the forward voltage drop of the diode 12, a negative potential is obtained from the output 24 of the circuit 10, and a ground potential is obtained from the output 26 of the circuit 10, whenever an input is applied to the circuit.

To obtain a negative potential from the output 26 and a ground potential from the output 24 when an input is applied to the circuit, one of two programming methods may be employed. If neither of the silicon diodes 12 or 16 has initially been irradiated with fast neutrons, the diode 12 may be irradiated, to the exclusion of the diode 16, by the source of fast neutrons 28, so that the forward voltage drop of the diode 12 is greater than the forward voltage drop of the diode 16. If, however, the diode 16 has already been irradiated with fast neutrons to obtain a negative potential at the output 24 of the circuit 10 and a ground potential at the output 26, the diode 12 may subsequently be irradiated with fast neutrons, to reprogram the circuit 10, such that the overall exposure of the diode 12 to fast neutrons is greater than the overall exposure of the diode 16 to fast neutrons and so that the forward voltage drop of the diode 12 is greater than the forward voltage drop of the diode 16. This may be accomplished since the increase in the forward voltage drop of a diffused silicon diode is proportional to the total fast neutron dose received by the diode.

When the diode 12 has been so irradiated and an input is applied to the circuit, the potential at the junction 44 is positive with respect to the potential at the junction point 42. Since the base-to-emitter potential of the transistor 14 is now greater than the base-to-emitter potential of the transistor 18, the transistor 14 is rendered conductive before the transistor 18 is rendered conductive. When the transistor 14 conducts, the voltage at the junction point 39, which is common to the emitters of both the transistors 14 and 18, becomes positive with respect to the voltage normally present when neither the transistors 14 nor 18 is conducting as a result of the voltage divider effect between the resistors 36 and 40. As a result of the more positive potential at the junction point 39, the voltage difference between the base and the emitter of the transistor 18 is decreased, thereby preventing the transistor 18 from conducting and providing a ground potential at the output 24 through the resistor 38. The output 26 displays a negative potential as a result of the voltage divider effect between the resistors 36 and 40. Therefore, when the diode 12 is irradiated to the exclusion of the diode 16, or when the diode 16 is initially irradiated but the diode 12 is subsequently irradiated to such an extent that its forward drop becomes greater than that of the diode 16, a negative potential is obtained at the output 26, and a ground potential is obtained at the output 24, of the circuit 10.

It is to be observed that the circuit 10 may be programmed, and reprogrammed, several times. For example, if the diode 16 were initially irradiated to obtain a negative potential at the output 24 and a ground potential at the output 26, the diode 12 could subsequently be irradiated to a greater extent than the diode 16, such that its overall forward voltage drop is greater than that of the diode 16, to obtain a negative potential from the output 26. If it is desired to again obtain a negative potential at the output 24 of the circuit 10, the diode 16 may be reirradiated to such an extent that its total dosage of fast neutrons is greater than the total dosage received by the diode 12, so that the forward voltage drop of the diode 16 is again greater than that of the diode 12 and so that a negative potential is again obtained at the output 24. If for some reason it is desirable to do so, the circuit may subsequently be reprogrammed further by again irradiating the diode 12 with fast neutrons to again obtain a negative potential at the output 26.

Figure 2:
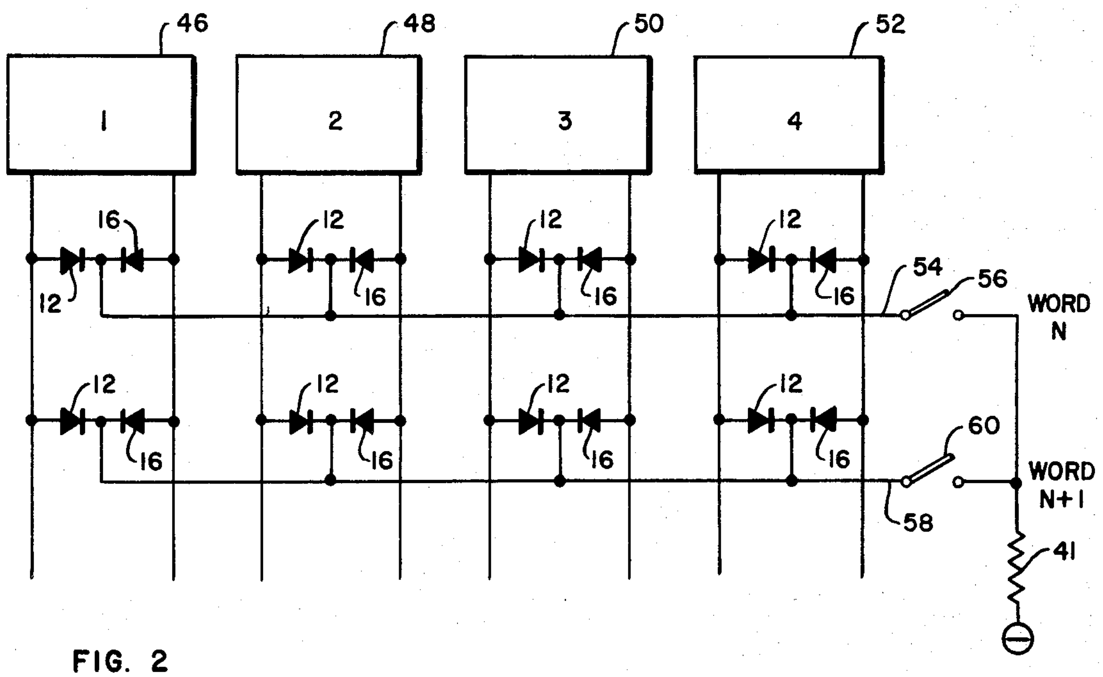
FIG. 2 is a block diagram of a read-only memory employing a plurality of the circuits of FIG. 1.

Referring to FIG. 2 of the drawings, there is shown an embodiment of a read-only memory circuit employing a plurality of the circuits 10 of FIG. 1 for providing a plurality of outputs in response to a single input. The four identical circuits 46, 48, 50 and 52 are each identical with the circuit 10 of FIG. 1, with the exception that the diodes 12 and 16 and the resistor 41 are not included therein.

In the specific embodiment of the read-only memory shown in FIG. 2, there are two pairs of diodes 12 and 16 associated with each of the circuits 46, 48, 50 and 52 for providing an input thereto, the first pair of diodes associated with each circuit being provided with a negative potential input over a conductor 54 through the resistor 41 upon the closure of a switch 56, and the second pair of diodes associated with each circuit being provided with a negative potential input over a conductor 58 through the resistor 41 upon the closure of a switch 60. The pairs of diodes 12 and 16 provided with an input over the conductor 54 may each be individually programmed with the source of fast neutrons 28 to provide a plurality of predetermined outputs from the circuits 46, 48, 50 and 52 upon the closure of the switch 56 to provide an output from the read-only memory circuit representative of a word N input, and each of the pairs of diodes 12 and 16 provided with an input over the conductor 58 may also be separately programmed with the source of fast neutrons 28 to provide a different predetermined output from the circuits 46, 48, 50 and 52 in response to the closure of the switch 60 to provide an output from the circuits representative of of the word N+1.

It is to be noted that the pairs of diodes 12 and 16 associated with the conductor 54 are normally programmed differently from the pairs of diodes 12 and 16 associated with the conductor 58, so that the outputs provided from the circuits 46, 48, 50 and 52 upon the closure of the switch 56, which is representative of the word N, are different from the outputs provided from the circuits upon the closure of the switch 60, which provides an output from the circuit representative of the word N+1. It is also to be noted that the circuit of FIG. 2 is not limited to the production of only two different combinations of outputs; but rather, further different outputs may be obtained from the circuits 46, 48, 50 and 52 by providing additional pairs of diodes, with their associated input conductors and switches, similar to the conductor 54, the switch 56 and their associated pairs of diodes, for each additional combinations of outputs desired in response to a word input. Also, the number of individual outputs is not limited to those provided by the four circuits 46, 48, 50 and 52, but rather, additional outputs may be provided by simply connecting more circuits, similar to the circuits 46, 48, 50 and 52, to the conductors through associated pairs of diodes 12 and 16.

While two specific embodiments of the invention have been described in detail, it will be obvious that various modifications may be made from the specific details described without departing from the spirit and scope of the invention. In particular, while the invention has been described in terms of a specific circuit using diffused silicon diodes irradiated with fast neutrons, it will be apparent that various other semiconductive or other radiation-sensitive electrical devices could be used in many equivalent circuits. The main characteristic involved is that the electrical devices selected have a parameter that can readily be altered, preferable progressively, by selective exposure to radiation to provide selective outputs based on the value of the parameter.

What is claimed is:

1. A method for programming a circuit having first and second electrical devices, the circuit being arranged to provide either a first or a second output in response to an input to the circuit depending on the relative values of an electrical parameter of the devices, the devices being of a type experiencing progressive and permanent unidirectional changes in the parameter over a usable range in response to increasing doses of radiation and initially having nominally identical values of the parameter, which comprises:

selectively irradiating one of the devices with a dosage of radiation capable of permanently altering the parameter of that device; and thereafter applying the input to the circuit to provide the first output if the first device has been irradiated and to provide the second output if the second device has been irradiated.

2. A method as recited in claim 1, wherein the devices are semiconductive devices.

3. A method as recited in claim 2, wherein the devices are diodes and the parameter is the forward voltage drop, and wherein the irradiating step comprises bombarding the selected diode with fast neutrons to raise the forward voltage drop of that diode above the forward voltage drop of the nonselected diode.

4. A method as recited in claim 3, wherein the first and the second diodes are diffused silicon diodes.

5. A method for programming a circuit to provide a first output, and then reprogramming the circuit to provide a second output, the circuit having first and second electrical devices and being arranged to provide either a first or a second output in response to an input to the circuit depending on the relative values of an electrical parameter of the devices, the devices initially having nominally identical values of the parameter, which comprises:

irradiating the first device to a first degree with radiation capable of altering the parameter parameter that device sufficiently to provide the first output in response comprise bombarding the input; and thereafter irradiating the second device to a greater degree than the first to provide the second output in response to the input, the devices being of a type experiencing a progressive unidirectional change in the parameter over a usable range with increasing doses of the radiation.

6. A method as recited in claim 5, wherein the devices are diodes and the parameter is the forward voltage drop, and wherein the irradiating steps comprise bombarding diodes in sequence with fast neutrons, the dosage in the second step being greater than in the first to raise the forward voltage drop of the second diode above that of the first diode.

7. A method as recited in claim 6, wherein the first and the second diodes are diffused silicon diodes.

8. A method of providing a first or a second output from a circuit in response to the application of an input to the circuit, which comprises:

connecting a first diode to a first current switching device to control the conduction thereof, the first diode being of a type experiencing permanent and progressive changes in an electrical parameter thereof with increasing doses of a radiation;

connecting a second diode to a second current switching device to control the conduction thereof, the second diode being of a type experiencing permanent and progressive changes in an electrical parameter thereof with increasing doses of a radiation;

selectively irradiating one of the diodes with a dosage of radiation to alter the electrical parameter of that diode; and thereafter applying the input to the circuit to cause the first switching device to conduct and to provide the first output if the first diode has been irradiated and to cause the second switching device to conduct and to provide the second output if the second diode has been irradiated.

9. A method as recited in claim 8, wherein the electrical parameter is the forward voltage drop of the diode and wherein selectively irradiating one of the diodes comprises bombarding the selected diode with a dosage of fast neutrons to raise the forward voltage drop of the selected diode above the forward voltage drop of the nonselected diode.

10. A method a recited in claim 9 wherein:

the first and second diodes are diffused silicon diodes; and the first and second current switching devices are transistor switching devices.

11. A method of changing the output of a circuit having two diodes from a first to a second state, the output from the circuit being provided in response to the application of an input to the circuit, the circuit being characterized in that a first state is provided at the output in response to the input if the forward voltage drop of the first diode is greater than the forward voltage drop of the second diode, and vice versa, the circuit initially being characterized in that the first diode has a greater forward voltage drop than the second diode so that the output of the circuit assumes the first state upon the application of the input, and the second diode being of a type which experiences a permanent and progressive unidirectional change in the forward voltage drop thereof in response to increasing doses of a radiation, which comprises:

irradiating the second diode with a dosage of radiation to raise the forward voltage drop of the second diode to such an extent that the forward voltage drop of the second diode, after irradiation, is greater than that of the first diode; and applying the input to the circuit, after irradiating the second diode, so that the output of the circuit assumes the second state.

12. A method as recited in claim 11, wherein irradiating the diode comprises bombarding the diode with fast neutrons.

13. A method as recited in claim 12, wherein the diodes are diffused silicon diodes.

14. A programmable system for providing either a first or a second output in response to an applied input, which comprises:

first and second electrical devices initially having nominally identical values of an electrical parameter, and being of a type experiencing a progressive an irreversible change in the electrical parameter over a usable range with increasing doses of a radiation;

means for selectively irradiating one of the devices with a dosage of radiation capable of irreversibly altering the parameter of that device; and means for connecting the devices in a circuit so that the first output is provided in response to the applied input to the circuit if the first device has been irradiated, and so that the second output is provided in response to the applied input if the second device has been irradiated.

15. A system as recited in claim 14, wherein the devices are diodes and the parameter is the forward voltage drop, and wherein the means for irradiating comprises a source of fast neutrons.

16. A system as recited in claim 15, wherein the first and the second diodes are diffused silicon diodes.

17. A programmable system for providing either a first or a second output in response to an applied input, which comprises:

first and second current switching devices;

first and second diodes, the first diode connected to the first switching device to control the conduction thereof and the second diode connected to the second switching device to control the conduction thereof, the diodes being of a type experiencing a progressive and irreversible change in the forward voltage drop thereof over a usable range with increasing doses of a radiation;

means for selectively irradiating one of the diodes with a dosage of radiation to increase the forward voltage drop thereof above the forward voltage drop of the nonselected diode; and means for applying a potential across the diodes, the diode having the greater forward voltage drop being responsive to render conductive its associated switching device to the exclusion of the conduction of the other switching device, so that irradiation of the first diode provides a first output from the system and so that irradiation of the second diode provides a second output from the system.

18. A system as recited in claim 17, wherein the means for irradiating comprises a source of fast neutrons.

19. A system as recited in claim 18, wherein the first and the second diodes are diffused silicon diodes.

20. A system as recited in claim 19, wherein the first and second current switching devices are first and second transistor switching devices.

21. A programmable system for providing either a first or a second state from each of a plurality of outputs, which comprises:

at least two pairs of electrical devices, the devices of each pair initially having nominally identical values of an electrical parameter and being of a type experiencing a progressive and irreversible change in the parameter over a usable range with increasing doses of a radiation;

means for selectively irradiating one of the devices in each pair of devices with a dosage of radiation capable of irreversibly altering the parameter of that device; and means for connecting the devices in a circuit having a separate output for each pair of devices, so that irradiation of the first diode of a pair provides a first state at its associated output and so that irradiation of the second diode of a pair provides a second state at its associated output, in response to an applied input to the circuit.

22. A system as recited in claim 21, wherein: the devices are diodes;

the parameter is the forward voltage drop; and
the means for irradiating comprises a source of fast neutrons.

23. A system as recited in claim 22, wherein the diodes are diffused silicon diodes.

24. A programmable system for providing either a first or a second state from each of a plurality of outputs, which comprises:
at least two pairs of current switching devices;
a separate output associated with each pair of switching devices;
a pair of diodes for each pair of switching devices, the first diode of each pair of diodes being connected to the first device of its associated pair of devices to control the conduction thereof, and the second diode of each pair of diodes being connected to the second device of its associated pair of devices to control the conduction thereof, the diodes of each pair initially having a nominally identical forward voltage drop and being of a type experiencing a progressive and irreversible increase in the forward voltage drop with increasing doses of a radiation;
means for selectively irradiating one of the diodes in each pair of diodes with a dosage of radiation to irreversibly increase the forward voltage drop thereof above the forward voltage drop of the nonselected diode; and
means for applying a potential across each pair of diodes, the diode in each pair of diodes having the greater forward voltage drop being responsive to render conductive its associated switching device to the exclusion of the conduction of the other switching device of the pair, so that irradiation of the first diode of a pair of diodes provides a first state from the associated output and so that irradiation of the second diode of a pair of diodes provides a second state from the associated output.

25. A system as recited in claim 24, wherein:
the means for irradiating comprises a source of fast neutrons; and
the diodes are diffused silicon diodes.

26. A system as recited in claim 25, wherein the current switching devices are transistor switching devices.

27. A method of programming a circuit having at least two pairs of electrical devices, the circuit being arranged to provide either a first or a second state from an output associated with each pair of electrical devices, in response to an input to the circuit, depending on the relative values of an electrical parameter of each device in each pair of devices, the devices in each pair initially having nominally identical values of the parameter and being of a type experiencing a progressive and irreversible change in the parameter with increasing doses of a radiation, which comprises:
selectively irradiating one of the devices in each pair of devices with a dosage of radiation capable of irreversibly altering the parameter of that device sufficiently to provide the first state from the associated output if the first device of the pair has been irradiated and to provide the second state from the associated output if the second device of the pair has been irradiated.

28. A method as recited in claim 27, wherein the devices are semiconductive devices.

29. A method as recited in claim 28, wherein:
the devices are diffused silicon diodes;
the parameter is the forward voltage drop; and
the irradiating step comprises bombarding the selected diode with a dosage of fast neutrons to raise the forward voltage drop of that diode above the forward voltage drop of the nonselected diode.

30. A method of programming and reprogramming a circuit having at least two pairs of electrical devices, the circuit being arranged to provide either a first or a second state from an output associated with each pair of electrical devices, in response to an input to the circuit, depending upon the relative values of an electrical parameter of each device in each pair of devices, the devices in each pair initially having nominally identical values of the parameter, which comprises:
selectively irradiating one of the devices in each pair of devices to a first degree with radiation capable of altering the parameter of that device sufficiently to provide the first state from the associated output if the first device of the pair has been irradiated and to provide the second state from the associated output if the second device of the pair has been irradiated; and thereafter
irradiating the other device of each pair to a greater degree than the first to provide the opposite state at the associated output, the devices being of a type experiencing a progressive unidirectional change in the parameter over a usable range with increasing doses of the radiation.

31. A method as recited in claim 30, wherein:
the devices are diffused silicon diodes;
the parameter is the forward voltage drop;
the irradiating steps comprise bombarding the diodes in sequence with fast neutrons, the dosage in the second step being greater than in the first to raise the forward voltage drop of the diode irradiated second in each pair above that of the other diode.

32. A method of changing the state of two or more outputs of a circuit having a plurality of outputs from a first to a second state, or vice versa, in response to the application of an input to the circuit, the circuit having a pair of diodes associated with each output and being characterized in that a first state is provided at an output if the forward voltage drop of the first diode of the pair of diodes associated with that output is greater than the forward voltage drop of the second diode of that pair, and vice versa, each diode of each pair of diodes being of a type experiencing a progressive and irreversible increase in the forward voltage drop thereof in response to increasing doses of a radiation, which comprises:
selecting in at least two pairs of diodes the diode which has the smaller forward voltage drop;
irradiating the selected diodes to such an extend that the forward voltage drop of the selected diode is greater after irradiating than the forward voltage drop of the nonselected diode; and
applying the input to the circuit so that the outputs associated with the selected diodes assume a second state if they initially had assumed a first state, and vice versa.

33. A method as recited in claim 32, wherein:
irradiating the diodes comprises bombarding the diodes with fast neutrons; and
the diodes are diffused silicon diodes.

* * * * *